United States Patent
Narita et al.

(10) Patent No.: US 9,121,869 B2
(45) Date of Patent: Sep. 1, 2015

(54) PROBE ASSEMBLY, PROBE CARD INCLUDING THE SAME, AND METHODS FOR MANUFACTURING THESE

(71) Applicant: Kabushiki Kaisha Nihon Micronics, Tokyo (JP)

(72) Inventors: Satoshi Narita, Aomori (JP); Kenji Sasaki, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 217 days.

(21) Appl. No.: 13/719,161

(22) Filed: Dec. 18, 2012

(65) Prior Publication Data

US 2013/0154682 A1 Jun. 20, 2013

(30) Foreign Application Priority Data

Dec. 20, 2011 (JP) .................................. 2011-278018

(51) Int. Cl.
*G01R 1/073* (2006.01)
*H05K 13/00* (2006.01)

(52) U.S. Cl.
CPC ............ *G01R 1/073* (2013.01); *G01R 1/07342* (2013.01); *H05K 13/00* (2013.01); *Y10T 29/49117* (2015.01)

(58) Field of Classification Search
None
See application file for complete search history.

(56) References Cited

U.S. PATENT DOCUMENTS

| 2009/0264025 A1* | 10/2009 | Hamada et al. ............ 439/733.1 |
| 2010/0029099 A1* | 2/2010 | Hamada et al. ................ 439/66 |
| 2011/0159444 A1* | 6/2011 | Hamada et al. ............... 430/315 |

FOREIGN PATENT DOCUMENTS

| JP | 09-329627 | 12/1997 |
| JP | 2001-153885 | 6/2001 |
| JP | 2007-285801 | 11/2007 |
| KR | 1020100137240 A | 12/2010 |
| TW | I322267 B | 3/2010 |

* cited by examiner

*Primary Examiner* — Paresh Patel
(74) *Attorney, Agent, or Firm* — Ingrassia Fisher & Lorenz, P.C.

(57) ABSTRACT

Quality of connection portions between respective probes and respective wires in a probe assembly is improved. Also, time required for work for connection between the probes and the wires is shortened. Further, improper connection between the probes and the wires is eliminated. A probe assembly includes an electric insulating substrate, a plurality of probes supported on one surface of the substrate, a plurality of through holes provided in the substrate to respectively correspond to the plurality of probes and filled with a conductive material attached to the respective probes, and a plurality of conductive membranes formed on the other surface of the substrate and respectively attached to the conductive material in the plurality of through holes.

6 Claims, 16 Drawing Sheets

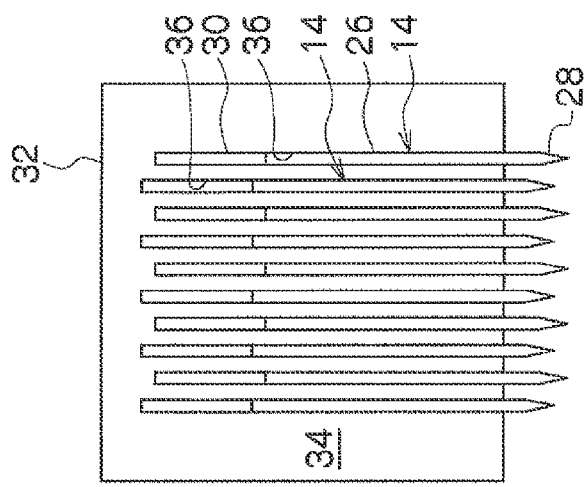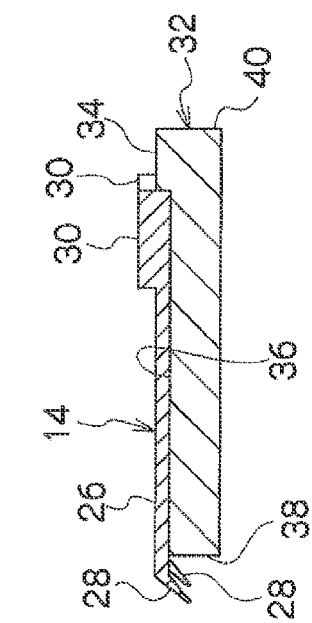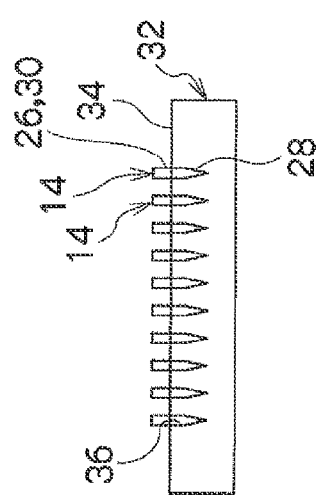

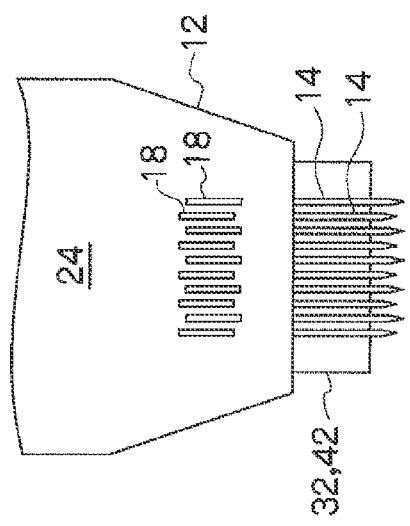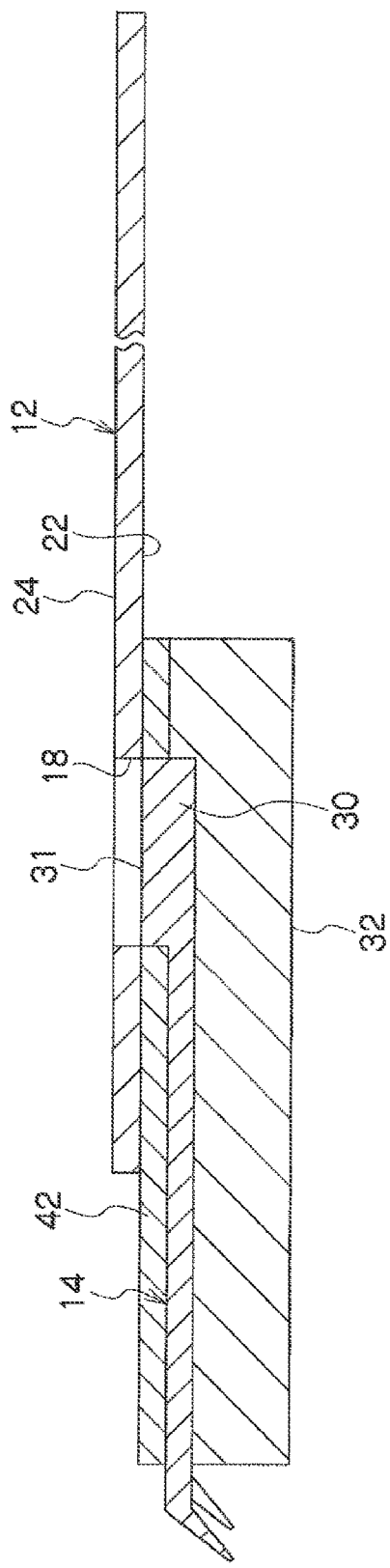

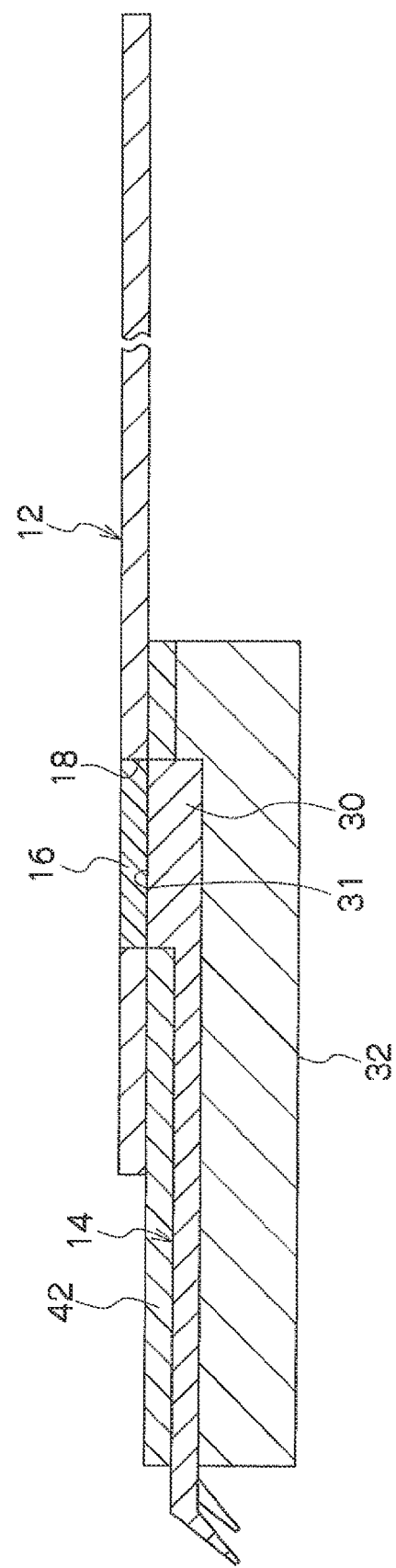

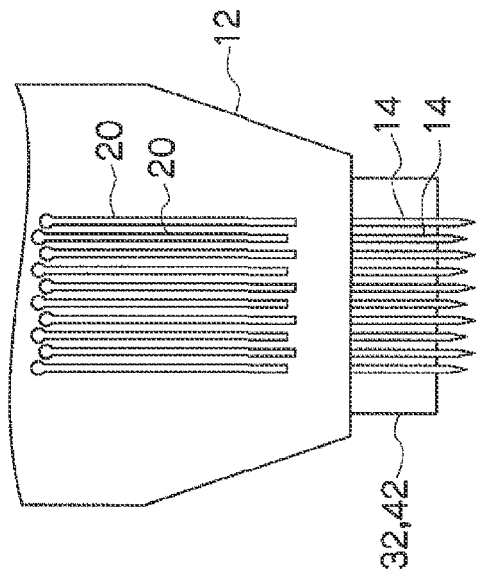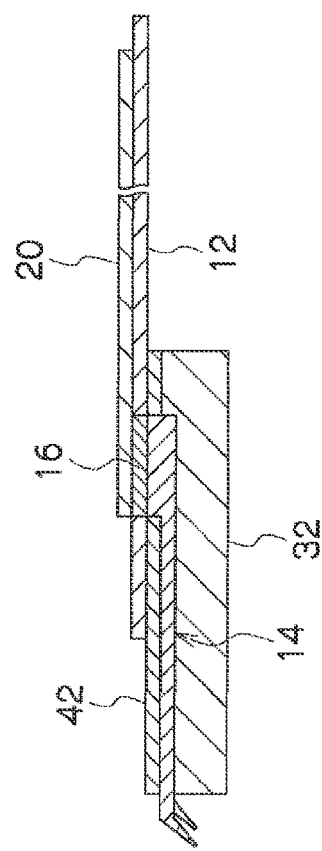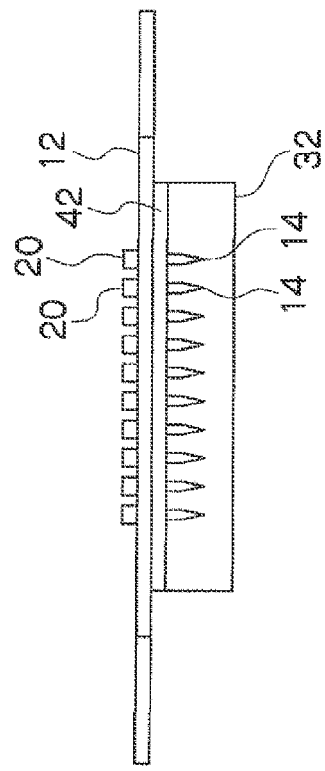

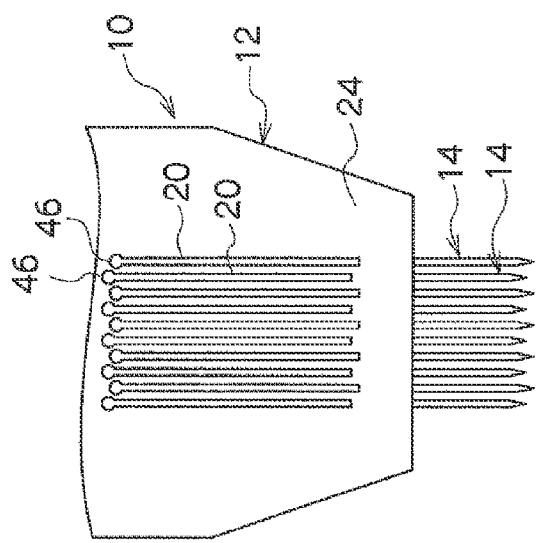
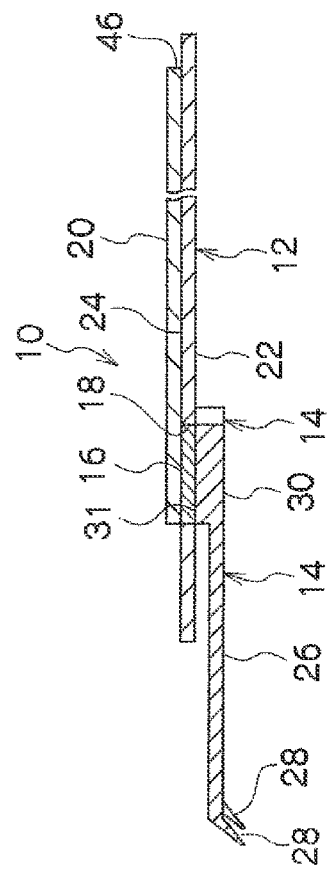
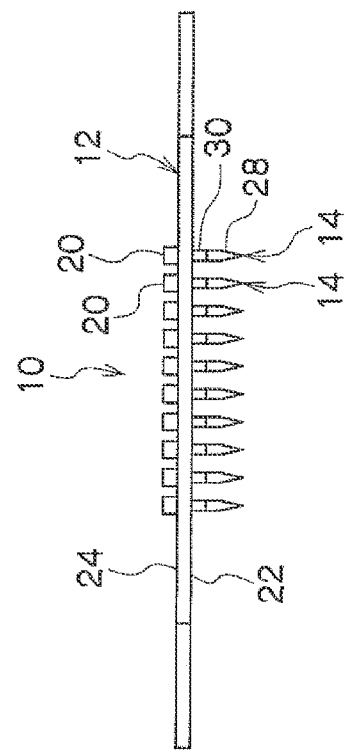

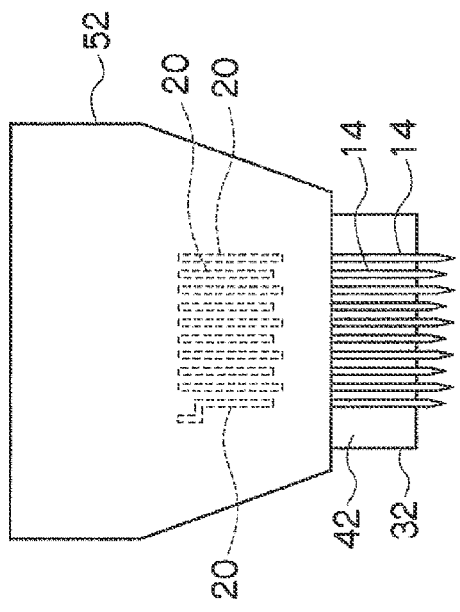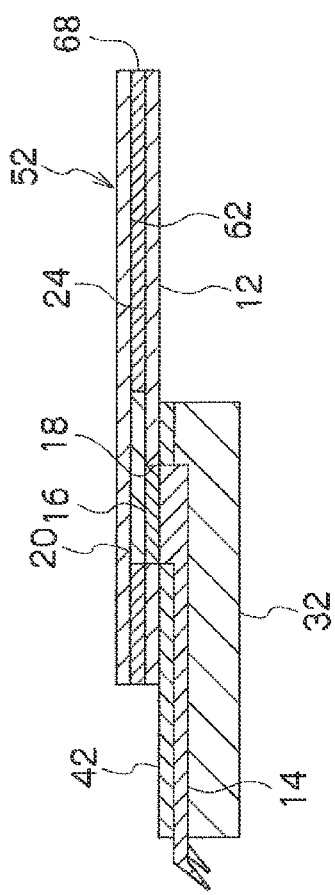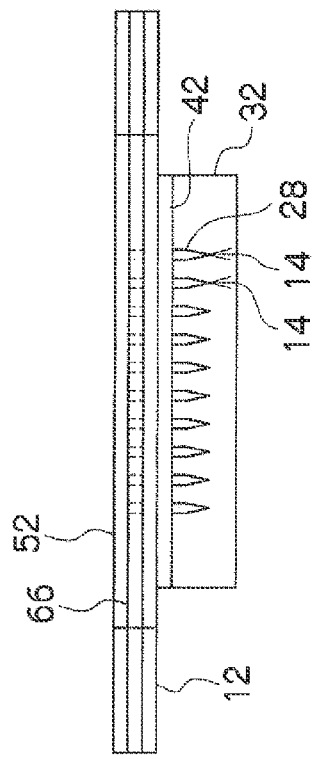

PROBE ASSEMBLY, PROBE CARD INCLUDING THE SAME, AND METHODS FOR MANUFACTURING THESE

TECHNICAL FIELD

The subject matter relates to a probe card, a probe assembly as a main component of the probe card, and methods for manufacturing these.

BACKGROUND

In a functional test of a manufactured semiconductor integrated circuit is used a probe card as an electromechanical connection jig electrically connecting a device under test which is the semiconductor integrated circuit to a testing apparatus testing the device under test.

A conventional probe card includes a base plate and a probe assembly as a basic part attached to the base plate. The probe assembly includes an electric insulating substrate having two opposed surfaces, a plurality of probes supported on one surface of the substrate, and wires electrically connected to the respective probes and extending via holes provided in the substrate from one surface to the other surface of the substrate (refer to Patent Literature 1 described later).

In the functional test of the device under test, the device under test is arranged in the testing apparatus, and the probe card is attached to the testing apparatus. At this time, the respective wires of the probe assembly included in the probe card are electrically connected to the testing apparatus, and the respective probes of the probe assembly forcedly contact respective electrodes of the device under test at point end portions or probe tip portions thereof. By doing so, the testing apparatus and the device under test are electrically connected via the probes and the wires.

In the conventional probe card, the respective probes and the respective wires are connected by soldering, and a large part of soldering work depends on human hand. This brings about a problem in which the quality of connection portions between the respective probes and the respective wires is influenced by a worker's technical capabilities and experiences. Also, there is a problem in which the larger the number of electrodes in the device under test is, that is to say, the larger the number of probes corresponding to the number of electrodes is, the more time is required for the soldering work for connection between the probes and the wires, which causes a problem of inducing improper connection between the probes and the wires.

CITATION LIST

Patent Literature 1: Japanese National Patent Appln. Public Disclosure No. H9-329627

SUMMARY

Quality of connection portions between respective probes and respective wires in a probe card is improved. Also, time required for work for connection between the probes and the wires is shortened. Further, improper connection between the probes and the wires is eliminated.

The subject matter relates to a probe assembly, a probe card including the same, and methods for manufacturing these.

A probe assembly according to an embodiment includes an electric insulating substrate having two surfaces opposed to each other, a plurality of probes supported on one surface of the substrate, a plurality of through holes provided in the substrate to respectively correspond to the plurality of probes and filled with a conductive material attached to the respective probes, and a plurality of conductive membranes formed on the other surface of the substrate and respectively attached to the conductive material in the plurality of through holes.

Also, a probe card according to an embodiment includes a base plate and the aforementioned probe assembly attached to the base plate. The probe assembly is arranged so that the other surface of a substrate thereof may be opposed to the base plate and so that a plurality of conductive membranes thereof may contact a plurality of lands formed on the base plate, respectively. As an example of the probe card, the probe assembly is fixed on the base plate via a presser tool at the substrate thereof and is fixed on the base plate via a platform arranged between the substrate and the base plate.

The substrate of the probe assembly is made of a flexible printed wiring board, for example. Each probe supported on the substrate includes an elongated main body, and a point end portion (probe tip portion) and a base end portion respectively connected to ends of the main body, for example. The conductive material filling the through holes is made of a plating layer, preferably, a copper plating layer, for example. The plating layer in each through hole is attached to the base end portion of each probe, for example. Also, the conductive membrane formed on the other surface of the substrate is made of a plating layer, preferably, a copper plating layer, for example.

A manufacturing method according to an embodiment for the aforementioned probe assembly includes preparing a jig having a surface and a plurality of recesses opened to the surface, arranging a plurality of probes each having a base end portion in the plurality of recesses of the jig so that each probe may extend along each recess and so that a part of the base end portion of each probe may be outside each recess, forming on the surface of the jig a covering layer covering the surface and the probes, removing a part of the covering layer or a part of the covering layer and parts of the base end portions of the probes for the purpose of forming an exposed surface exposing the base end portions of the probes and parallel to the surface of the jig, attaching to the exposed surface one surface of an electric insulating substrate having two surfaces opposed to each other, providing the substrate with through holes opposed to the base end portions of the respective probes, filling the respective through holes with a conductive material, forming on the other surface of the substrate conductive membranes to be attached to the conductive material in the respective through holes, removing the covering layer, and removing the jig.

Also, a manufacturing method according to an embodiment for a probe card including the aforementioned probe assembly includes arranging on and attaching to a base plate a substrate of the manufactured probe assembly so that the other surface of the substrate may be opposed to the base plate and so that a plurality of conductive membranes of the substrate may contact a plurality of lands formed on the base plate, respectively.

The jig is made of a ceramic block, for example, and the surface to which the recesses are opened is preferably a flat surface. Each of the probes can be arranged in the recess so that the probe tip portion thereof may project from the recess. The covering layer covering the surface of the jig and the probes is made of a plating layer, preferably, a copper plating layer, for example. This plating layer can be removed by etching later. A flat surface defined by the base end portions of the probes can be formed by providing the covering layer or the covering layer and the base end portions of the probes with a grinding process. The electric insulating substrate to be attached to the base end portions of the probes defining the flat surface is made of a flexible printed wiring board, for example. Formation of the through holes in the substrate can be performed with use of an excimer laser processing machine, for example. Filling of the holes with the conductive material can be performed by forming a plating layer, preferably, a copper plating layer, in the holes, for example. Each of the conductive membranes to be formed on the other surface of the substrate can be made of a plating layer, preferably, a copper plating layer (wiring pattern).

Another probe assembly according to another embodiment includes an electric insulating first substrate having two surfaces opposed to each other, a plurality of probes supported on one surface of the first substrate, a plurality of first through holes provided in the first substrate to respectively correspond to the plurality of probes and filled with a conductive material attached to the respective probes, a plurality of first conductive membranes formed on the other surface of the first substrate and respectively attached to the conductive material in the plurality of first through holes, an electric insulating second substrate which has two surfaces opposed to each other and whose one surface faces the first substrate and is piled on the first substrate, a plurality of second through holes provided in the second substrate to respectively correspond to the plurality of first conductive membranes and filled with a conductive material attached to the respective first conductive membranes, and a plurality of second conductive membranes formed on the other surface of the second substrate and respectively attached to the conductive material in the plurality of second through holes.

Also, another probe card according to another embodiment includes a base plate and the aforementioned probe assembly attached to the base plate. The probe assembly is arranged so that the other surface of the second substrate thereof may be opposed to the base plate and so that the plurality of second conductive membranes thereof may contact a plurality of lands formed on the base plate, respectively. As an example of the probe card, the probe assembly is fixed on the base plate via a presser tool at the first and second substrates thereof and is fixed on the base plate via a platform arranged between the second substrate and the base plate.

Another manufacturing method according to another embodiment for the aforementioned other probe assembly includes preparing a jig having a surface and a plurality of recesses opened to the surface, respectively arranging a plurality of probes each having a base end portion in the plurality of recesses of the jig so that each probe may extend along each recess and so that a part of the base end portion of each probe may be outside each recess, forming on the surface of the jig a covering layer covering the surface and the probes, removing a part of the covering layer or a part of the covering layer and parts of the base end portions of the probes for the purpose of forming an exposed surface exposing the base end portions of the probes and parallel to the surface of the jig, attaching to the exposed surface one surface of an electric insulating first substrate having two surfaces opposed to each other, providing the first substrate with first through holes opposed to the base end portions of the respective probes, filling the respective first through holes provided in the first substrate with a conductive material, forming on the other surface of the first substrate first conductive membranes to be attached to the conductive material in the respective first through holes, piling on the first substrate one surface of an electric insulating second substrate having two surfaces opposed to each other toward the other surface of the first substrate, providing the second substrate with second through holes opposed to the respective first conductive membranes, filling the respective second through holes provided in the second substrate with a conductive material, forming on the other surface of the second substrate second conductive membranes to be attached to the conductive material in the respective second through holes, removing the covering layer, and removing the jig.

Another manufacturing method according to another embodiment for the aforementioned other probe card includes arranging on and attaching to a base plate a second substrate of the manufactured other probe assembly so that the other surface of the second substrate may be opposed to the base plate and so that a plurality of second conductive membranes of the substrate may contact a plurality of lands formed on the base plate, respectively.

While respective probes and respective wires are connected by soldering in a probe card conventionally, the soldering is not used in the probe assembly, the probe card including the same, and the methods for manufacturing these according to embodiments, and thus connection portions between the probes and the wires can be constant without variation in quality. Also, even in a case where the number of electrodes of a device under test, that is, the number of probes corresponding to the electrodes, is large, time required for connection between the probes and the wires can be shortened much further than in a conventional case. Further, improper connection between the probes and the wires can be eliminated.

BRIEF DESCRIPTION OF THE DRAWINGS

FIGS. 5A, 5B, and 5C are a plan view, a vertical cross-sectional view, and a side view illustrating the plurality of probes respectively arranged in a plurality of recesses of the jig, respectively.

FIGS. 9A and 9B are a plan view and a vertical cross-sectional view illustrating a state in which the substrate is provided with through holes, respectively.

FIG. 10 is a vertical cross-sectional view illustrating a state in which the through holes in the substrate are filled with a conductive material.

FIGS. 11A, 11B, and 11C are a plan view, a vertical cross-sectional view, and a side view illustrating a state in which conductive membranes are formed on the other surface of the substrate, respectively.

FIGS. 12A, 12B, and 12C are a plan view, a vertical cross-sectional view, and a side view of the probe assembly remaining after removal of the covering layer and the jig, respectively.

FIGS. 14A, 14B, and 14C are a plan view, a vertical cross-sectional view, and a side view illustrating a state in which a second substrate is connected on a first substrate, respectively.

DETAILED DESCRIPTION

Figure 1:
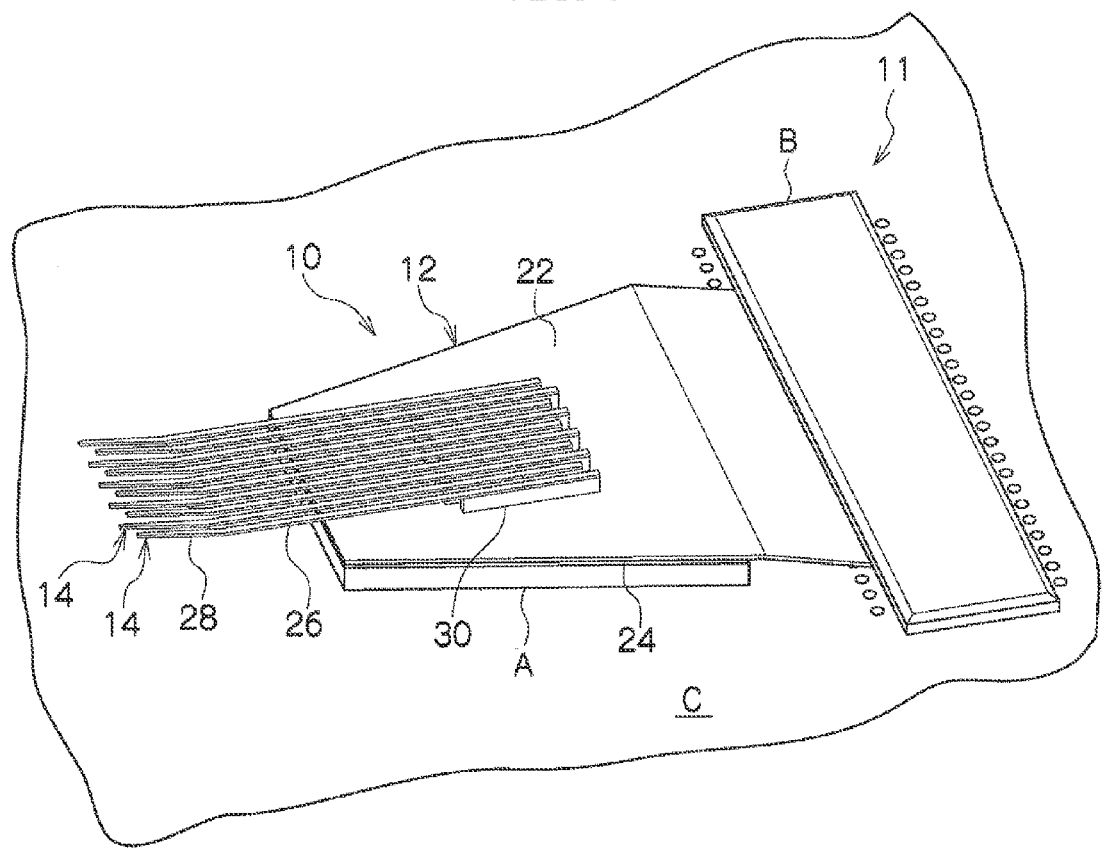
FIG. 1 is a perspective view of an embodiment of a probe card.
Figure 2:
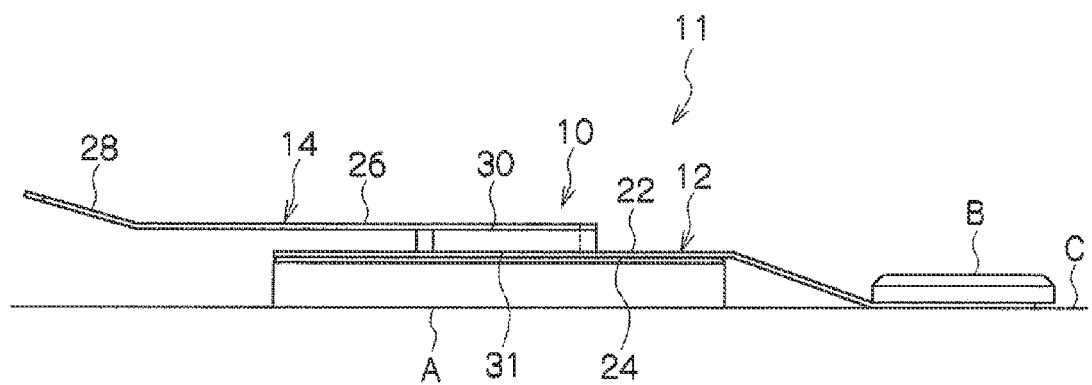
FIG. 2 is a side view of the probe card illustrated in FIG. 1.

Referring to FIG. 1 and FIG. 2, a probe assembly 10 and a probe card 11 are illustrated.

The probe assembly 10 includes an electric insulating substrate 12, a plurality of metallic probes 14 sometimes referred to as cantilever probes, as many through holes 18 (FIG. 12B) as the number of the probes 14 provided in the substrate 12 and filled with a conductive material 16, and as many conductive membranes 20 (FIGS. 12A to 12C) as the number of the probes 14 provided on the substrate 12.

The probe card 11 includes a base plate C and the probe assembly 10 attached to the base plate. The probe assembly 10 is arranged so that an after-mentioned surface 24 of the substrate 12 included in the probe assembly 10 may be opposed to the base plate C. More specifically, the probe assembly 10 is fixed on the base plate C via a presser tool B at the substrate 12 thereof and is fixed on the base plate C via a platform A arranged between the substrate 12 and the base plate C. The plurality of conductive membranes 20 of the probe assembly 10 contact at bumps 46 (FIG. 12A) formed at tip ends thereof a plurality of lands (not illustrated), which are as many as the number of bumps 46, formed on the base plate C, respectively.

The substrate 12 of the probe assembly 10 is made of a plate body such as a flexible printed wiring board and has two surfaces (flat surfaces) 22 and 24 opposed to each other. In the example illustrated in the figures, the substrate 12 includes a trapezoidal part formed in a trapezoidal flat shape and a rectangular part communicating with the trapezoidal part and formed in a rectangular flat shape. The substrate 12 can be formed in an arbitrary flat shape other than the aforementioned flat shape instead of the illustrated example. The platform A, described with reference to FIG. 1, is located on the trapezoidal part on a side of the surface 24 of the substrate 12, and the presser tool B is located on the rectangular part on a side of the surface 22 of the substrate 12. As the platform A, one having lower thermal expansion coefficient than that of the probe 14 is preferably selected.

Figure 3:
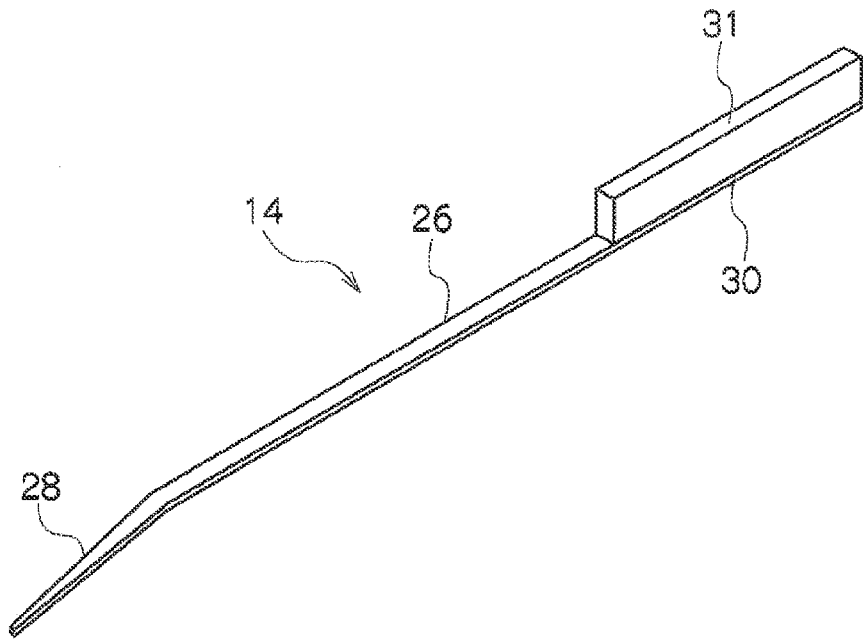
FIG. 3 is a perspective view of a probe to be used in manufacturing an embodiment of a probe assembly and the probe card.

The plurality of probes 14 are respectively arranged in parallel to be spaced from one another on the surface 22 of the substrate 12 and are supported on the substrate 12. Each probe 14 includes an elongated main body 26, and a probe tip portion 28 and a base end portion 30 respectively connected to one end portion and the other end portion of the main body as illustrated in FIG. 1, FIG. 2, and FIG. 3.

The probe tip portion 28 of each probe 14 extends from one end portion of the main body 26 in a tapered shape to be angled relative to the main body 26, and the base end portion 30 is made of a rectangular plate fixed at the other end portion of the main body 26. Also, the base end portion 30 of each probe 14 has a flat joint surface 31 attached to the surface 22 of the substrate 12 (refer to FIG. 2). By doing so, each probe 14 is supported via the base end portion 30 thereof on the substrate 12 in a state in which the elongated main body 26 and the probe tip portion 28 thereof are spaced from the surface 22 of the substrate 12, that is, in a cantilevered state. Each probe 14 supported in a cantilevered manner can be flexed at the main body 26 thereof when the probe tip portion 28 thereof is pressed on an electrode of a device under test (semiconductor integrated circuit) for a functional test.

The plurality of illustrated probes 14 are arranged so that the main bodies 26 thereof may extend in parallel with the surface 22 of the substrate 12. An alternative of this can be arranging the probes 14 so that the main bodies 26 may extend to be angled relative to the surface 22 of the substrate 12, such as arranging the probes 14 so that the angle may gradually increase from the base end portions 30 to the probe tip portions 28. Also, although the plurality of illustrated probes 14 are arranged to be parallel to one another and so that the probe tip portions 28 thereof may be misaligned, the arrangement is determined in accordance with arrangement positions of electrodes of the device under test. Thus, the arrangement of the probes 14 is not limited to one illustrated in the figures.

As illustrated in FIG. 12B, the conductive material 16 filling each through hole 18 provided in the substrate 12 and opened to both the surfaces 22 and 24 of the substrate 12 is attached to the base end portion 30 as a part of each probe 14, more specifically, to the joint surface 31 of the base end portion 30, on a side of the surface 22 of the substrate 12. Also, each conductive membrane 20 provided on the substrate 12 extends on the surface 24 of the substrate 12 in an opposite direction of each probe 14 and is attached to the conductive material 16 filling each through hole 18 on a side of the surface 24 of the substrate 12. By doing so, each probe 14 and each conductive membrane 20 corresponding to the probe are electrically connected via the conductive material 16 in each through hole 18.

Filling of the through hole 18 with the conductive material 16 and formation of each conductive membrane 20, and attachment of the conductive material 16 to each probe 14 and each conductive membrane 20 can be performed mechanically without human hand with use of an after-mentioned manufacturing method according to an embodiment. A structure of mutual attachment of the conductive material 16 filling the respective through holes 18 to the respective probes 14 and the respective conductive membranes (wires) 20 brings quality improvement of connection portions between the respective probes 14 and the respective conductive membranes 16 in the probe assembly 10. The structure also enables reduction of time required for formation of the connection portions between the respective probes 14 and the respective conductive membranes 16 and eliminates improper connection between these.

Next, a method for manufacturing the probe assembly 10 according to an embodiment will be described.

Figure 4:
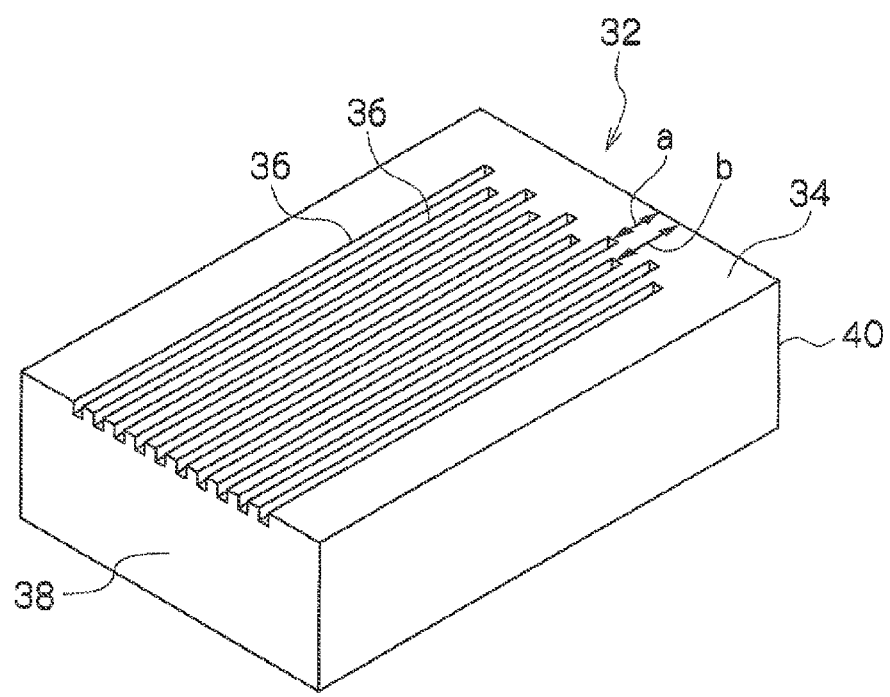
FIG. 4 is a perspective view of a jig to be used in manufacturing the probe assembly.

First, a jig 32 illustrated in FIG. 4 is prepared. The jig 32 has a surface 34 and as many recesses 36 as the number of the plurality of probes 14 arranged at regular intervals and opened to the surface 34. The jig 32 functions to receive the plurality of probes 14 in the plurality of recesses 36 and hold the probes 14 in an aligned state for manufacture of the probe assembly 10.

The jig 32 is made of a ceramic block formed in a rectangular solid shape, for example, and has six flat surfaces perpendicular to one another. The block has flat side surfaces 38 and 40 communicating with the surface 34 and opposed to each other. The jig 32 can be formed in another shape and can be made of another material. Also, the surface 34 of the jig may be a curved surface or a protruded and recessed surface instead of the illustrated example.

The plurality of recesses 36 extend on the surface 34 of the jig 32 from one side surface 38 to the other side surface 40 of the jig to be parallel to one another and terminate at positions before reaching the other side surface 40. Instead of this example, each recess 36 can be opened only to the surface 34.

Each recess 36 has a dimension enabling to receive each probe 14 so that each probe 14 may extend along each recess 36 and so that the base end portion 30 of each probe 14 may be outside each recess 36. In the illustrated example, each recess 36 has a shorter length dimension than a length dimension of each probe 14, more specifically, approximately a length dimension excluding the probe tip portion 28, an approximately equal depth dimension to a height dimension (dimension in an up-down direction in FIG. 2) of the main body 26 of each probe 14, and a slightly longer width dimension than a width dimension (dimension in a direction in the back side of the drawing sheet in FIG. 2) of the main body 26. By doing so, when each probe 14 is arranged in each recess 36 (refer to FIGS. 5A to 5C), the probe tip portion 28 and a part of the main body 26 communicating with the probe tip portion 28 project from one end of the jig 32 or the side surface 38 of the jig 32, and a part of the base end portion 30 projects upward from the surface 34 of the jig 32.

Also, the other ends of the plurality of recesses 36 are set to be misaligned alternately, that is, so that distances a and b between the other ends of two recesses 36 adjacent to each other and the other side surface 40 of the jig 32 may have relationship of a>b. Thus, one recess of two recesses 36 adjacent to each other has a longer (or shorter) length dimension than that of the other recess. The difference between the distance a and the distance b (a−b) is equal to the mutual difference between free ends of the probe tip portions 28 of two probes 14 adjacent to each other in a length direction of the probes as seen in FIG. 1.

As described above, the jig 32 functions to hold the plurality of probes 14 in an aligned state with one another and is eventually separated from these probes 14. In this respect, each recess 36 of the jig 32 can be one whose one end is not opened to one side surface 38, that is, one having a length dimension enabling to receive an entire length of each probe 14, or can be one having a depth dimension enabling to receive an entirety of the base end portion 30 of each probe 14 as well as the length dimension.

Subsequently, as illustrated in FIGS. 5A, 5B, and 5C, the plurality of probes 14 are arranged in the plurality of recesses 36 of the jig 32. As a result, the probe tip portion 28 and a part of the main body 26 communicating with the probe tip portion 28 project from the one end of each recess 36, and a part of the base end portion 30 projects to the upper side of the surface 34 of the jig 32 from each recess 36.

Figure 6A:
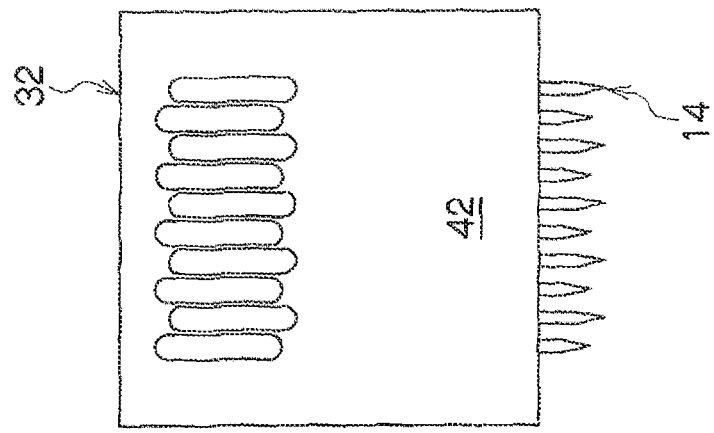
FIGS. 6A, 6B, and 6C are a plan view, a vertical cross-sectional view, and a side view illustrating a state in which a surface of the jig and the plurality of probes are covered with a covering layer, respectively.
Figure 6B:
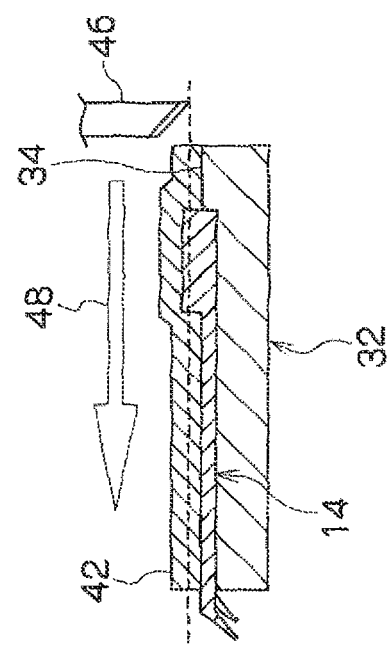
Figure 6C:
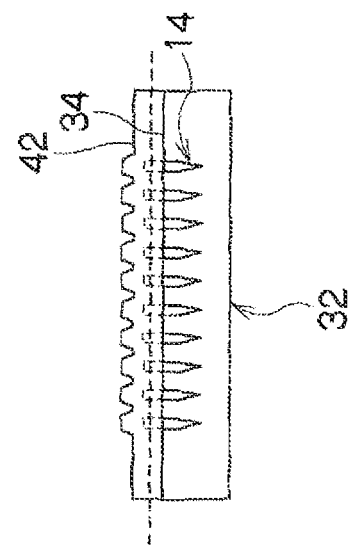

Subsequently, as illustrated in FIGS. 6A, 6B, and 6C, a covering layer 42 covering the surface 34 and the plurality of probes 14 is formed on the surface 34 of the jig 32.

Formation of the covering layer 42 causes all the probes 14 in the recesses 36 to be fixed on the surface 34 of the jig 32, and the aligned state of all the probes 14 is maintained. The covering layer 42 is made of a plating layer obtained with use of a known electroplating technique, preferably, a copper plating layer, for example.

Figure 7A:
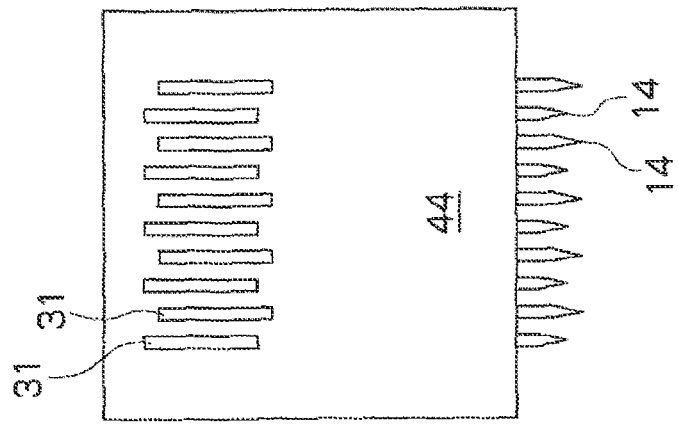
FIGS. 7A, 7B, and 7C are a plan view, a vertical cross-sectional view, and a side view illustrating a state in which a flat surface defined by base end portions of the plurality of probes is exposed, respectively.
Figure 7B:
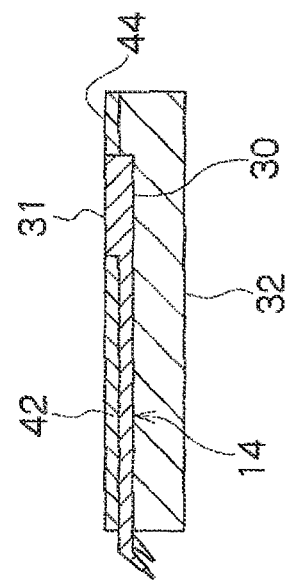
Figure 7C:
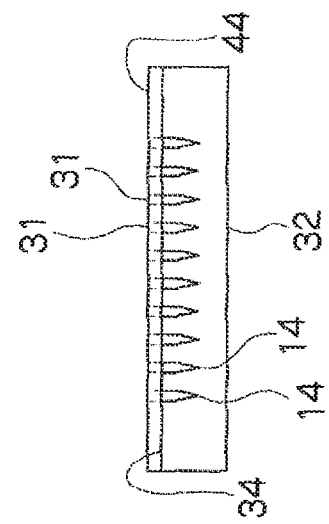

After formation of the covering layer 42, a part of the covering layer 42 and parts of the base end portions 30 of the plurality of probes 14 are removed to form a flat surface 44 parallel to the surface 34 of the jig 32. The flat surface 44 includes exposed surfaces of the base end portions generated by removal of the parts of the respective base end portions 30. The exposed surfaces are the joint surfaces 31 of the base end portions 30 of the plurality of probes 14 described with reference to FIG. 2 (refer to FIGS. 7A, 7B, and 7C). Instead of this example, the flat surface 44 may be formed by removing a part of the covering layer 42 until exposure of the base end portions 30.

Formation of the flat surface 44 can be performed by moving a grinding bit 46 (FIG. 6B) of a surface grinding machine in a direction of an arrow 48 to provide the covering layer 42 and the base end portions 30 inside the covering layer 42 with a grinding process, for example.

Figure 8A:
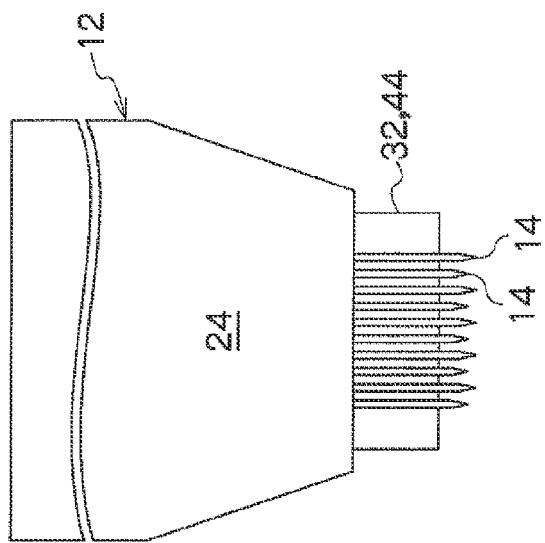
FIGS. 8A, 8B, and 8C are a plan view, a vertical cross-sectional view, and a side view illustrating a state in which a substrate is connected on the flat surface, respectively.
Figure 8B:
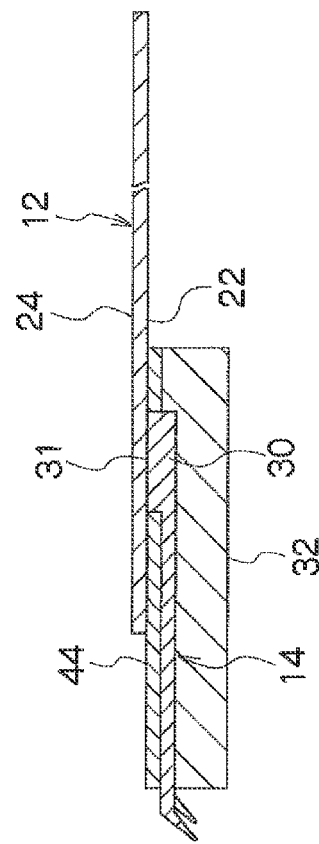
Figure 8C:
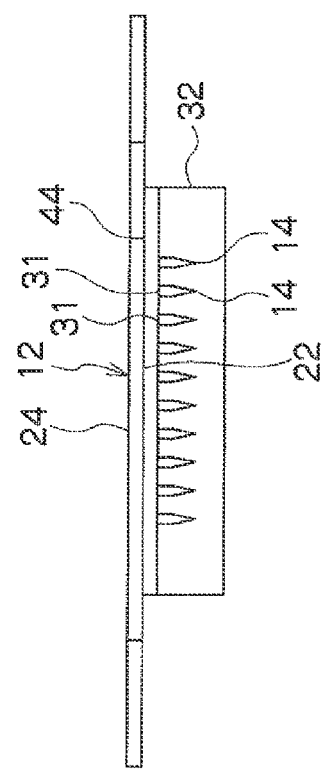

Thereafter, as illustrated in FIGS. 8A, 8B, and 8C, the electric insulating substrate 12 is mounted on the formed flat surface 44 and is attached at the surface 22 thereof to the flat surface 44. This causes the joint surfaces 31 of the base end portions 30 of the plurality of probes 14 to be covered with the substrate 12.

Subsequently, as illustrated in FIGS. 9A and 9B, the substrate 12 is provided with the plurality of through holes 18 corresponding to and opposed to the respective base end portions 30 of the plurality of probes 14. The respective through holes 18 are opened to the surface 22 and the surface 24 of the substrate 12. An end surface of each through hole 18 opened to the surface 22 of the substrate 12 is closed by the joint surface 31 of the base end portion 30 of each probe 14, and the joint surface 31 defines a closed end surface. The through holes 18 can be provided by a punching process with use of a known excimer laser processing machine (not illustrated), for example.

Subsequently, as illustrated in FIG. 10, the respective through holes 18 provided in the substrate 12 are filled with the conductive material 16. The conductive material 16 can be made of a plating layer obtained with use of a known electroplating technique, preferably, a copper plating layer, for example.

The joint surface 31 of the base end portion 30 of each probe 14 defines the closed end surface of each through hole 18, and thus when each through hole 18 is filled with the conductive material 16, the conductive material 16 contacts the joint surface 31 and is attached to the joint surface 31.

After filling of the respective through holes 18 with the conductive material 16, the conductive membranes 20 to be attached to the conductive material 16 in the respective through holes 18 are formed on the surface 24 of the substrate 12. These conductive membranes 20 form a wiring pattern (FIGS. 11A, 11B, and 11C).

Thereafter, the covering layer 42 is removed, and the jig 32 is thereafter removed. Removal of the covering layer 42 can be performed by etching with use of copper selective etchant in a case where the covering layer 42 is made of the copper plating layer. Removal of the covering layer 42 can release the jig 32 attached to the covering layer 42, and thus the jig 32 can be removed.

By removal of the covering layer 42 and removal of the jig 32, the probe assembly 10 according to the present embodiment, in which the conductive material 16 in the respective through holes 18 acts as connection portions between the respective probes 14 and the respective conductive membranes 20, can be obtained.

The obtained probe assembly 10 has the tip end portions (bumps) 46 of the respective conductive membranes 20 corresponding to the respective electrodes of the device under test spaced relatively narrowly from one another. Conversely, another probe assembly 50 (refer to FIG. 18A) according to another embodiment and a probe card (not illustrated) including the probe assembly 50 have bumps spaced more largely.

The probe assembly 50 can be manufactured in a procedure illustrated in FIG. 5A to FIG. 12C and FIG. 13 to FIG. 18B.

Figure 18A:
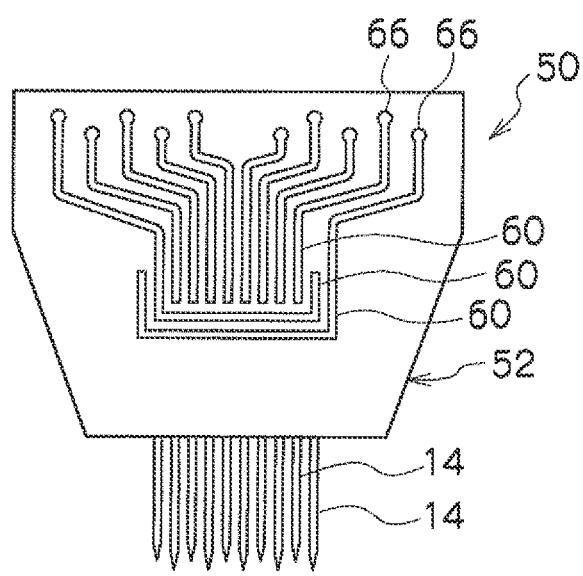
FIGS. 18A and 18B are a plan view and a vertical cross-sectional view of the other probe assembly remaining after removal of the covering layer and the jig, respectively.
Figure 18B:
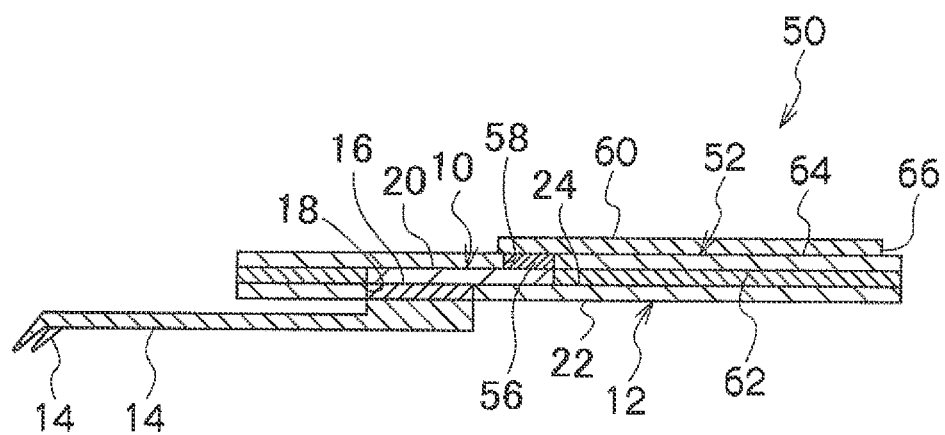

The probe assembly 50 includes the probe assembly 10 and after-mentioned another substrate 52 arranged to be piled on the probe assembly 10 as illustrated in FIG. 18B. As described above, the probe assembly 10 includes the electric insulating substrate (first substrate) 12 having the two surfaces 22 and 24 opposed to each other, the plurality of probes 14, the respective through holes (first through holes) 18 filled with the conductive material 16 attached to the respective probes, and the plurality of conductive membranes (first conductive membranes) 20 formed on the other surface of the first substrate 12 and respectively attached to the conductive material 16 in the plurality of first through holes 18. The other probe assembly 50 further includes an electric insulating second substrate 52 which has two surfaces 62 and 64 opposed to each other and whose surface 62 faces the first substrate 12 and is piled on the first substrate, a plurality of second through holes 58 provided in the second substrate to respectively correspond to the plurality of first conductive membranes 20 and filled with a conductive material 56 attached to the respective first conductive membranes 20, and a plurality of second conductive membranes 60 formed on the surface 64 of the second substrate 52 and respectively attached to the conductive material 56 in the plurality of second through holes 58. The plurality of second conductive membranes 60 have end portions (bumps) 66 respectively corresponding to the plurality of electrodes of the device under test.

Figure 13:
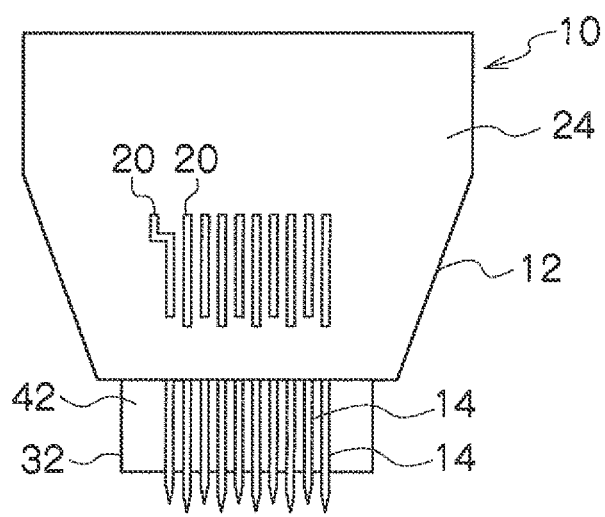
FIG. 13 is a plan view of another embodiment of a probe assembly that is being manufactured in a similar state to that illustrated in FIG. 11A.

For manufacture of the probe assembly 50, the probe assembly 10 (FIG. 13) similar to one described above is manufactured through the procedure illustrated in FIGS. 5A-5C to FIGS. 12A-12C. The probe assembly 10 illustrated in FIG. 13 differs from the probe assembly 10 illustrated in FIG. 12A, in which all the conductive membranes 20 extend linearly, in that one (one located on the left end as seen in FIG. 13) of the plurality of first conductive membranes 20 extends in a hook shape. This is a provision for exchange of right and left wires, that is, a provision to be carried out so that the first conductive membrane 20 located on the left end (as seen in FIG. 13) may be connected to the second conductive membrane 60 extending toward the right end (as seen in FIGS. 18A and 18B), and so that the first conductive membrane 20 located on the right end (as seen in FIG. 13) may be connected to the second conductive membrane 60 extending toward the left end (as seen in FIG. 18A).

Subsequently, as illustrated in FIGS. 14A, 14B, and 14C, the electric insulating second substrate 52 is mounted on the first substrate 12 having formed thereon the first conductive membranes 20 and is attached at the surface 62 thereof to the first substrate 12. This causes the plurality of first conductive membranes 20 to be covered with the second substrate 52. At this moment, a film (such as a dry film and a polyimide film) 66 can be attached to the surface 24 of the first substrate 12 except the first conductive membranes 20 to cover the surface 24 in advance. This enables an uneven surface formed by the surface 24 and the first conductive membranes 20 to be relatively flat. This can also improve electric characteristics such as insulation and inductance. In a case of using the film 68, the second substrate 52 is attached to the film 68 covering the surface 24.

Figure 15A:
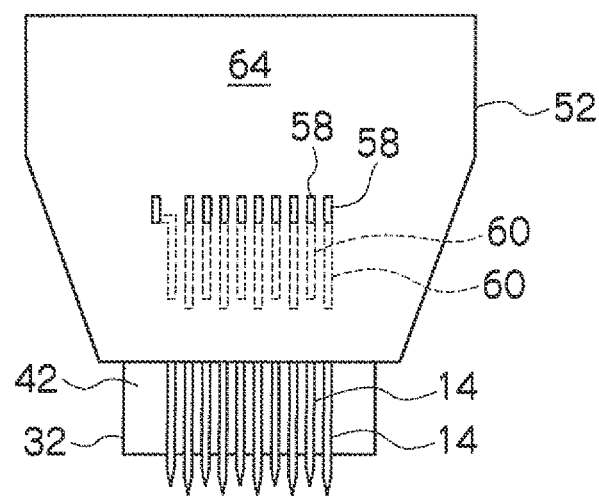
FIGS. 15A and 15B are a plan view and a vertical cross-sectional view illustrating a state in which the second substrate is provided with through holes, respectively.
Figure 15B:
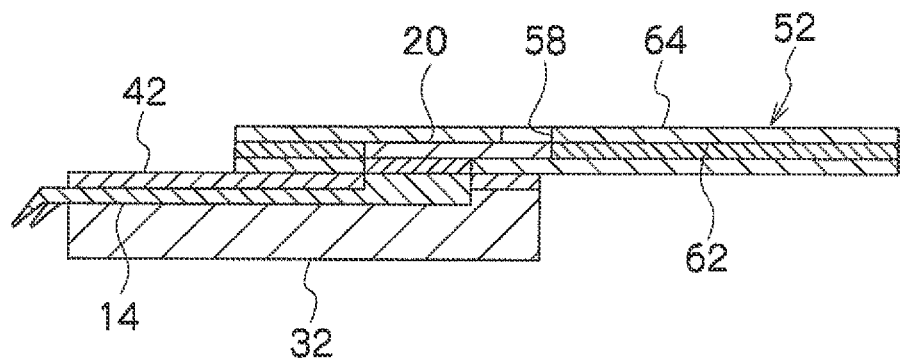

Subsequently, as illustrated in FIGS. 15A and 15B, the second substrate 52 is provided with the plurality of second through holes 58 corresponding to and opposed to the plurality of respective first conductive membranes 20. The respective second through holes 58 are opened to the surface 62 and the surface 64 of the second substrate 52. An end surface of each second through hole 58 opened to the surface 62 of the second substrate 52 is closed by each first conductive membrane 20, and the first conductive membrane defines a closed end surface. The second through holes 58 can be provided by a punching process with use of a known excimer laser processing machine (not illustrated), for example, in a similar manner to that of the first through holes 18.

Figure 16A:
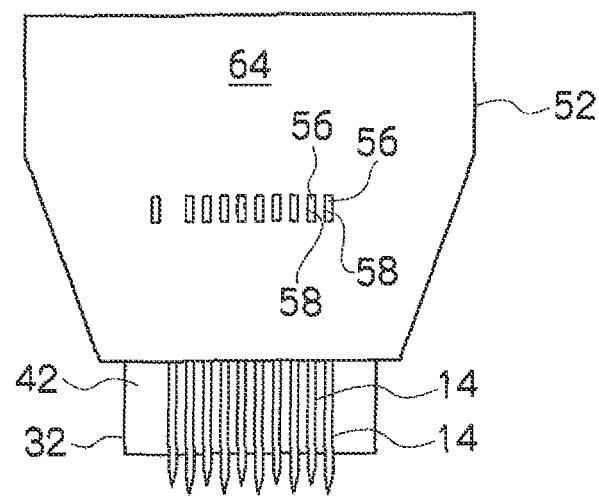
FIGS. 16A and 16B are a plan view and a vertical cross-sectional view illustrating a state in which the through holes in the second substrate are filled with a conductive material, respectively.
Figure 16B:
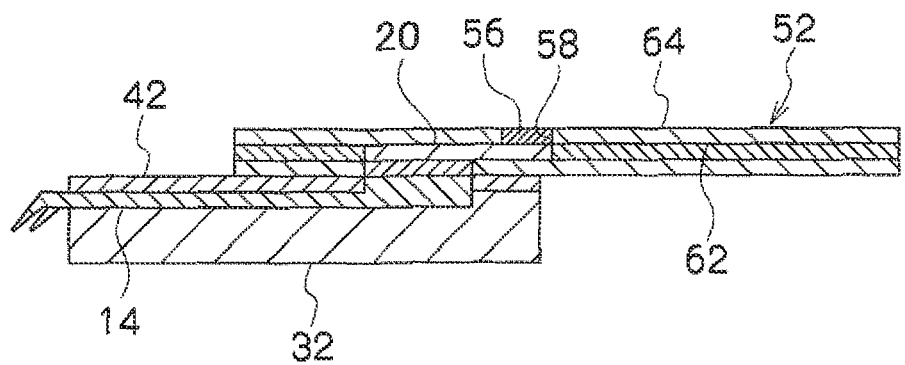

Subsequently, as illustrated in FIGS. 16A and 16B, the respective second through holes 58 provided in the second substrate 52 are filled with the second conductive material 56. The second conductive material 56 can be made of a plating layer obtained with use of a known electroplating technique, preferably, a copper plating layer, for example, in a similar manner to that of the first conductive material 16.

The first conductive membrane 20 defines the closed end surface of each second through hole 58, and thus when each second through hole 58 is filled with the second conductive material 56, the second conductive material 56 contacts the first conductive membrane 20 and is attached to the first conductive membrane 20.

Figure 17A:
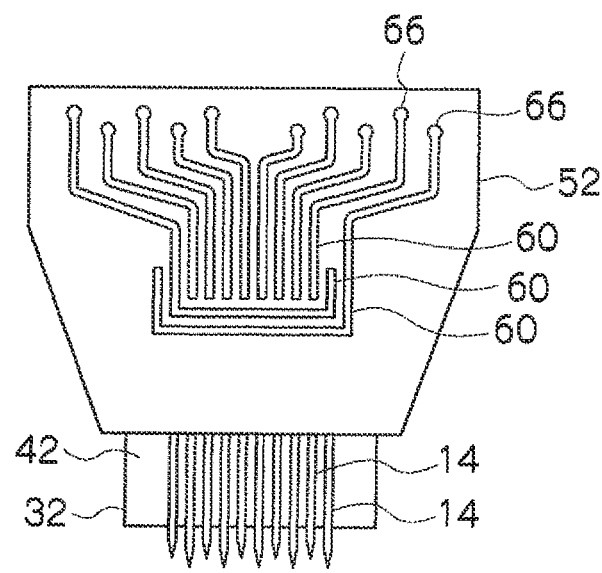
FIGS. 17A and 17B are a plan view and a vertical cross-sectional view illustrating a state in which conductive membranes are formed on the other surface of the second substrate, respectively.
Figure 17B:
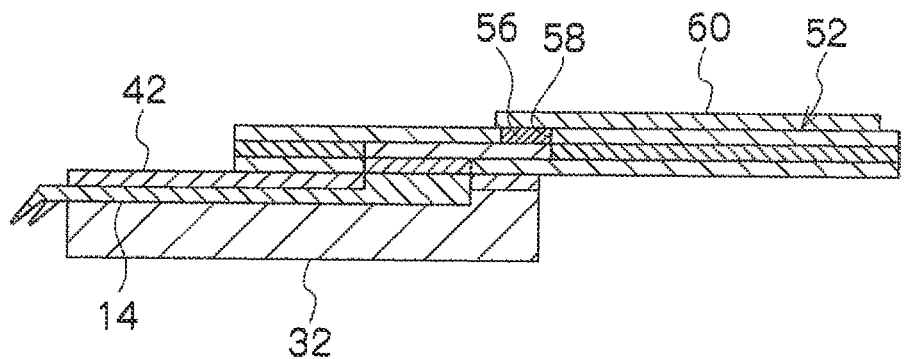

After filling of the respective second through holes 58 with the second conductive material 56, the second conductive membranes 60 to be attached to the second conductive material 56 in the respective second through holes 58 are formed on the surface 64 of the second substrate 52. These second conductive membranes 60 form a wiring pattern (FIGS. 17A and 17B).

Thereafter, the covering layer 42 is removed, and the jig 32 is thereafter removed (FIGS. 18A and 18B). Removal of the covering layer 42 can be performed by etching with use of copper selective etchant in a case where the covering layer 42 is made of the copper plating layer in a similar manner to that described above. Removal of the covering layer 42 can release the jig 32 attached to the covering layer 42, and thus the jig 32 can be removed.

By removal of the covering layer 42 and removal of the jig 32, the probe assembly 50, in which the conductive material 16 in the respective through holes 18 acts as connection portions between the respective probes 14 and the respective first conductive membranes 20, and in which the conductive material 56 in the respective second through holes 58 acts as connection portions between the respective first conductive membranes 20 and the respective second conductive membranes 60, can be obtained.

The probe card (not illustrated) including the probe assembly 50 is made by attaching the probe assembly 50 to the base plate C in a similar manner to that of the probe card including the probe assembly 10. The probe assembly 50 is arranged so that the surface 64 of the second substrate 52 included in the probe assembly 50 may be opposed to the base plate C. More specifically, the probe assembly 50 is fixed on the base plate C via the presser tool B at the first and second substrates 12 and 52 thereof and is fixed on the base plate C via the platform A arranged between the second substrate 52 and the base plate C. Similarly, the plurality of second conductive membranes 60 of the probe assembly 50 contact at the bumps 66 formed at tip ends thereof a plurality of lands (not illustrated), which are as many as the number of bumps 66, formed on the base plate C, respectively.

What is claimed is:

1. A method for manufacturing a probe assembly comprising:
    preparing a jig having a surface and a plurality of recesses opened to the surface;
    respectively arranging a plurality of probes each having a base end portion in the plurality of recesses of the jig so that each probe may extend along each recess and so that a part of the base end portion of each probe may be outside each recess;
    forming on the surface of the jig a covering layer covering the surface and the probes;
    removing a part of the covering layer and parts of the base end portions of the probes for the purpose of forming an exposed surface exposing the base end portions of the probes and parallel to the surface of the jig;
    attaching, to the exposed surface, one surface of an electric insulating substrate having two surfaces opposed to each other;
    providing the substrate with through holes opposed to the base end portions of the respective probes;
    filling the respective through holes with a conductive material;
    forming on the other surface of the substrate conductive membranes to be attached to the conductive material in the respective through holes;
    removing the covering layer; and
    removing the jig.

2. A method for manufacturing a probe card comprising:
    arranging and fixing on a base plate a substrate of a probe assembly manufactured in accordance with the method for manufacturing a probe assembly according to claim 1 so that the other surface of the substrate may be opposed to the base plate and so that a plurality of conductive membranes of the substrate may contact a plurality of lands formed on the base plate, respectively.

3. A method for manufacturing a probe assembly according to claim 1, further comprising:
    after forming on the other surface of the substrate conductive membranes to be attached to the conductive material in the respective through holes, and before removing the covering layer, piling on the substrate an electric insulating second substrate having two surfaces opposed to each other with one surface of the second substrate on the other surface of the substrate;
    providing the second substrate with second through holes opposed to the respective conductive membranes;
    filling the respective second through holes provided in the second substrate with a conductive material; and
    forming on the other surface of the second substrate second conductive membranes to be attached to the conductive material in the respective second through holes.

4. A method for manufacturing a probe card comprising:
    arranging and fixing on a base plate a second substrate of a probe assembly manufactured in accordance with the method for manufacturing a probe assembly according to claim 3 so that the other surface of the second substrate may be opposed to the base plate and so that a plurality of second conductive membranes of the substrate may contact a plurality of lands formed on the base plate, respectively.

5. A method for manufacturing a probe card according to claim 2, further comprising:
    fixing the probe assembly on the base plate via a presser tool at the substrate thereof and fixing on the base plate via a platform arranged between the substrate and the base plate.

6. A method for manufacturing a probe card according to claim 4, further comprising:
    fixing the probe assembly on the base plate via a presser tool at the substrate thereof and fixing on the base plate via a platform arranged between the substrate and the base plate.

\* \* \* \* \*